(12) United States Patent
Annunziata et al.

(10) Patent No.: US 10,388,857 B2
(45) Date of Patent: Aug. 20, 2019

(54) SPIN TORQUE MRAM FABRICATION USING NEGATIVE TONE LITHOGRAPHY AND ION BEAM ETCHING

(71) Applicant: INTERNATIONAL BUSINESS MACHINES CORPORATION, Armonk, NY (US)

(72) Inventors: Anthony J. Annunziata, Stamford, CT (US); Armand A. Galan, New York, NY (US); Steve Holmes, Ossining, NY (US); Eric A. Joseph, White Plains, NY (US); Gen P. Lauer, Yorktown Heights, NY (US); Qinghuang Lin, Yorktown Heights, NY (US); Nathan P. Marchack, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 370 days.

(21) Appl. No.: 15/184,109

(22) Filed: Jun. 16, 2016

(65) Prior Publication Data

US 2017/0062707 A1    Mar. 2, 2017

Related U.S. Application Data

(62) Division of application No. 14/840,176, filed on Aug. 31, 2015.

(51) Int. Cl.
| | |
|---|---|
| *H01L 43/10* | (2006.01) |
| *H01L 43/12* | (2006.01) |
| *H01L 43/02* | (2006.01) |
| *H01L 43/08* | (2006.01) |
| *G11C 11/16* | (2006.01) |

(Continued)

(52) U.S. Cl.
CPC .......... *H01L 43/12* (2013.01); *G03F 7/70325* (2013.01); *G03F 7/70425* (2013.01); *G11C 11/161* (2013.01); *H01L 27/228* (2013.01); *H01L 43/02* (2013.01); *H01L 43/08* (2013.01); *H01L 43/10* (2013.01); *G11C 2211/5615* (2013.01); *H01L 27/222* (2013.01)

(58) Field of Classification Search
CPC ... H01L 27/228; H01L 27/222; H01L 27/226; H01L 27/2463; H01L 27/1052; H01L 27/115; H01L 27/22
USPC ........................................................ 257/421
See application file for complete search history.

(56) References Cited

U.S. PATENT DOCUMENTS

| | | |
|---|---|---|
| 6,692,898 B2 | 2/2004 | Ning |
| 6,780,736 B1 | 8/2004 | Holmes et al. |

(Continued)

OTHER PUBLICATIONS

S. Chun et al., "Negative electron-beam resist hard mask ion beam etching process for the fabrication of nanoscale magnetic tunnel junctions," Journal of Vacuum Science & Technology B, Nov./Dec. 2012, pp. 06FA01-1-06FA01-5., vol. 30, No. 6.

(Continued)

*Primary Examiner* — Robert G Bachner
(74) *Attorney, Agent, or Firm* — Tutunjian & Bitetto, P.C.; Vazken Alexanian

(57) ABSTRACT

A magnetoresistive memory cell includes a magnetic tunnel junction pillar having a circular cross section. The pillar has a pinned magnetic layer, a tunnel barrier layer, and a free magnetic layer. A first conductive contact is disposed above the magnetic tunnel junction pillar. A second conductive contact is disposed below the magnetic tunnel junction pillar.

8 Claims, 7 Drawing Sheets

(51) Int. Cl.
*G03F 7/20* (2006.01)
*H01L 27/22* (2006.01)

(56) References Cited

U.S. PATENT DOCUMENTS

| | | |
|---|---|---|
| 7,470,374 B2 | 12/2008 | Hattori et al. |
| 8,105,850 B1 | 1/2012 | Abraham et al. |
| 8,138,097 B1* | 3/2012 | Isobayashi .......... H01L 21/0332 |
| | | 257/E21.231 |
| 8,609,262 B2 | 12/2013 | Horng et al. |
| 2010/0078763 A1 | 4/2010 | Hosotani et al. |
| 2014/0169085 A1* | 6/2014 | Wang .................... G11C 11/161 |
| | | 365/158 |
| 2017/0018704 A1* | 1/2017 | Chuang .................. H01L 43/02 |

OTHER PUBLICATIONS

S. Chun et al., "Multi-step ion beam etching of sub-30 nm magnetic tunnel junctions for reducing leakage and MgO barrier damage," Journal of Applied Physics, Mar. 2012, pp. 07C722-1-07C722-3, vol. 111, No. 7.
B. Y. Zong et al., "Fabrication of ultrahigh density metal-cell-metal crossbar memory devices with only two cycles of lithography and dry-etch procedures," Nanotechnology, May 20, 2013, pp. 2-9, vol. 24, 2013, 9 pages.
List of IBM Patents or Patent Applications Treated as Related dated Jun. 16, 2016, 2 pages.

\* cited by examiner

SPIN TORQUE MRAM FABRICATION USING NEGATIVE TONE LITHOGRAPHY AND ION BEAM ETCHING

BACKGROUND

Technical Field

The present invention relates to magnetoresistive random access memory (MRAM) and, in particular, to improved patterning techniques for the fabrication of MRAM.

Description of the Related Art

Spin-transfer torque magnetoresistive random access memory (STT-MRAM) devices offer many benefits over semiconductor-based memories such as dynamic RAM (DRAM) and static RAM (SRAM). However, patterning MRAM devices at the small sizes (e.g., <50 nm), large densities (>1 Gb/cm$^2$), and high uniformity (e.g., <+3 nm) needed to compete with DRAM and SRAM is difficult. Two of the most difficult-to-solve problems encountered are poor uniformity across large arrays and low yield of devices smaller than 50 nm. Existing fabrication techniques produce devices that vary significantly in their size and electrical properties, often producing devices that are non-functional or are outside of design parameters. As a result, many devices that are formed for memory arrays are not suitable for the task.

STT-MRAM is a non-volatile memory technology that uses spin-aligned electrons to transfer torque to magnetic domains of the memory device. The torque delivered to the magnetic domain changes the amount of current needed to change the magnetic state of a cell.

Conventional methods of forming MRAM devices use positive-tone resist developer and a positive resist with a bright-field reticle to form the MRAM stack. However, these methods suffer from a lack of roundness and uniformity in their critical dimensions.

SUMMARY

A magnetoresistive memory cell includes a magnetic tunnel junction pillar having a circular cross section, comprising a pinned magnetic layer, a tunnel barrier layer, and a free magnetic layer. A first conductive contact is disposed above the magnetic tunnel junction pillar. A second conductive contact is disposed below the magnetic tunnel junction pillar.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention provide significant improvements in patterning uniformity and yield compared to conventional magnetoresistive random access memory (MRAM) techniques. The present embodiments employ negative-tone resist developer combined with a positive resist, or positive-tone developer and a negative resist, with a dark-field reticle to form an MRAM device. Devices produced according to the present embodiments provide uniformity as good as, or superior to, processes that are much more costly and complex. Furthermore, the present embodiments employ proven complementary metal oxide semiconductor manufacturing techniques, making them particularly practical.

Figure 1:
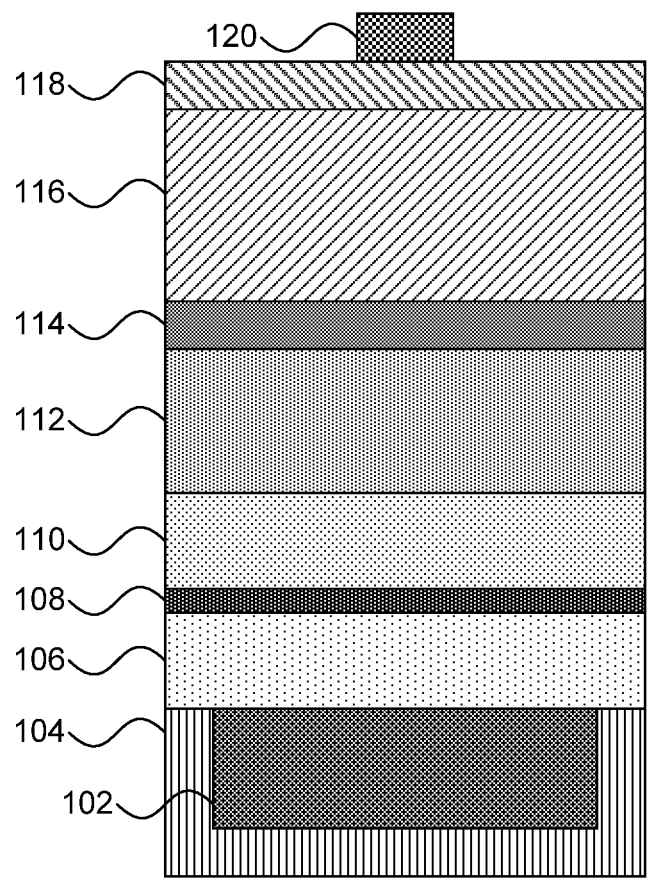
FIG. 1 is a cross-sectional view of a step in fabricating a magnetoresistive random access memory device in accordance with one embodiment of the present principles.

Referring now to FIG. 1, a step in fabricating an MRAM cell is shown. A stack of dielectrics and metals is formed, from which an MRAM device will be etched. The stack may be formed by any appropriate deposition process, including for example chemical vapor deposition, atomic layer deposition, and physical vapor deposition. At the bottom of the stack, a base layer is formed from a copper channel 104, representing the underlying back-end-of-line circuitry, and a tantalum nitride landing pad 102. The base layer may have appropriate electrical connections to other devices on the chip and provides one contact for the eventual device.

A magnetic tunnel junction layer 106 is formed with a positively ionized ruthenium layer 110 over it and a cap layer 108 between them. The magnetic tunnel junction layer 106 has an exemplary thickness of, e.g., about 350 angstroms, while the ruthenium ion layer 110 has an exemplary thickness of, e.g., about 200 angstroms. It should be noted that the magnetic tunnel junction layer 106 itself has multiple constituent layers, including a pinned layer, a free layer, and a tunnel barrier layer. Information is stored in the magnetic tunnel junction based on the alignment or anti-alignment between magnetizations of the pinned layer and the free layer, with the magnetization of the free layer being changed by currents that tunnel through the tunnel barrier. The resistive state of the device changes with the relative magnetization, and the state of the device can thereby be read out by applying a read current.

A hardmask layer 112 formed from, e.g., tantalum nitride, is formed over the ruthenium ion layer 110 with an exemplary thickness of, e.g., about 1,000 angstroms. An oxide layer 114 is formed over the hardmask layer 112 with an exemplary thickness of, e.g., about 250 angstroms. An organic planarizing layer (OPL) 116 of e.g., HM8006, having an exemplary thickness of, e.g., about 2000 angstroms, is formed over the oxide layer 114 with a silicon-doped antireflection coating (SiARC) 118, having an exemplary thickness of, e.g., about 200 angstroms, over the OPL layer 114.

A photoresist layer 120 is formed over the SiARC 118. It is specifically contemplated that the photoresist layer may be formed from a positive tone resist such as, e.g., AIM7946. A photolithographic mask (not shown) is formed on the stack. It is specifically contemplated that 193 nm negative tone development dry lithography is used, but it should be understood that the present principles can be extended to 193 nm immersion lithography as well. The photolithographic mask is transparent in the area where a photoresist material is to remain. In this case, the photoresist layer 120 remains on the SiARC layer 118 to define the photoresist. The photoresist layer has an exemplary critical dimension (e.g., diameter) of about 150 nm. In one specific embodiment, it is contemplated that a positive tone photoresist material is paired with a negative tone developer and masked with a dark field reticle to produce the island of photoresist material 120, but it should be understood that the same effect can be obtained using a negative tone photoresist material, a positive tone developer, and a bright field reticle. In either case, the reticle produces an island of photoresist material with superior roundness and uniformity. In one specific embodiment, a negative tone photoresist is used with a solvent developer such as n-butyl acetate and provides superior resist image quality relative to a positive tone resist with an aqueous tetramethyl ammonium hydroxide developer.

Figure 2:
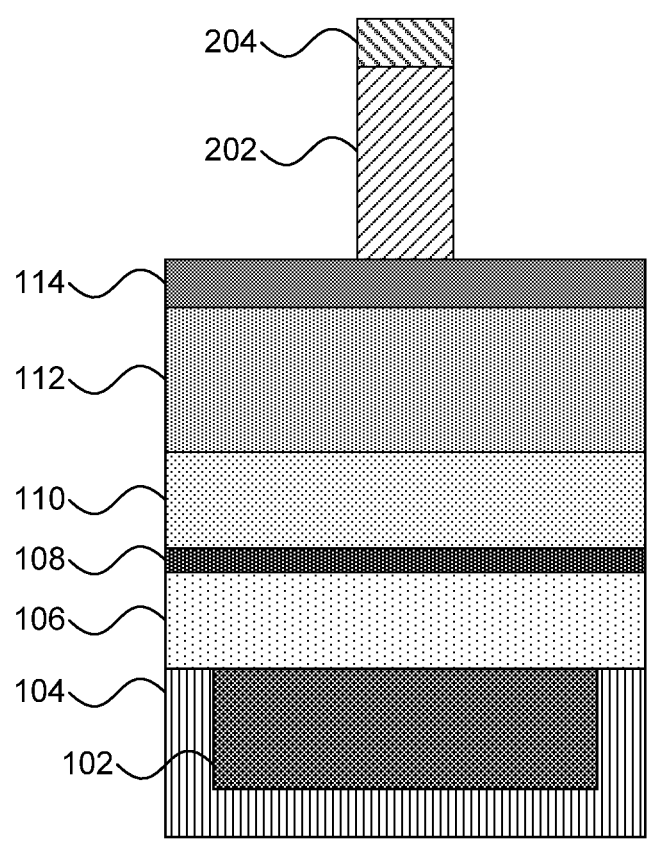
FIG. 2 is a cross-sectional view of a step in fabricating a magnetoresistive random access memory device in accordance with one embodiment of the present principles.

Referring now to FIG. 2, a step in fabricating an MRAM cell is shown. A reactive ion etch (RIE) has been performed using the photoresist layer 120 as a mask. This etch leaves a pillar of SiARC 204 and OPL 202. The resulting pillar has a critical dimension of, e.g., about 150 nm.

Figure 3:
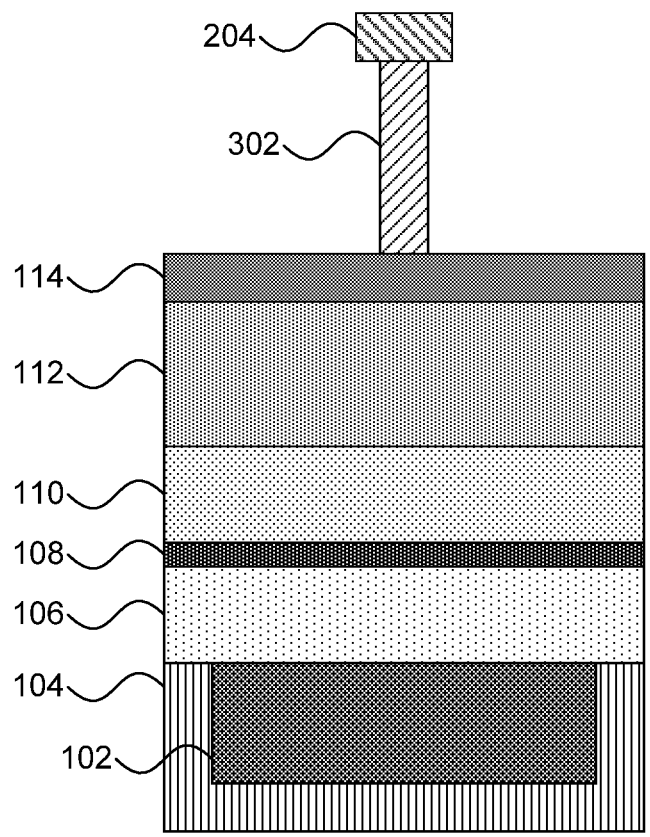
FIG. 3 is a cross-sectional view of a step in fabricating a magnetoresistive random access memory device in accordance with one embodiment of the present principles.

Referring now to FIG. 3, a step in fabricating an MRAM cell is shown. A further etch is employed that selectively etches the OPL layer 202 without affecting the SiARC cap 204 or the oxide layer 114. This thins the OPL 302 to a smaller diameter, leaving the larger SiARC cap 204 on top. In one example, the remaining pillar of OPL 302 has a critical dimension of less than about 70 nm, while the SiARC cap 204 retains its diameter of about 150 nm.

Figure 4:
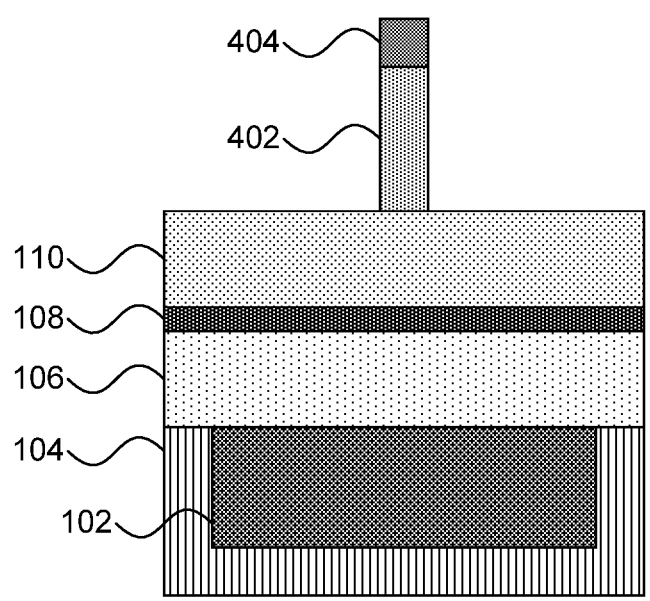
FIG. 4 is a cross-sectional view of a step in fabricating a magnetoresistive random access memory device in accordance with one embodiment of the present principles.

Referring now to FIG. 4, a step in fabricating an MRAM cell is shown. Another RIE etch is performed using the SiARC cap 202 and OPL pillar 302 to pattern the metal layer 112 and oxide layer 114 to form a pillar of the metal 402 and oxide 404 having a diameter similar to that of the OPL pillar 302.

Figure 5:
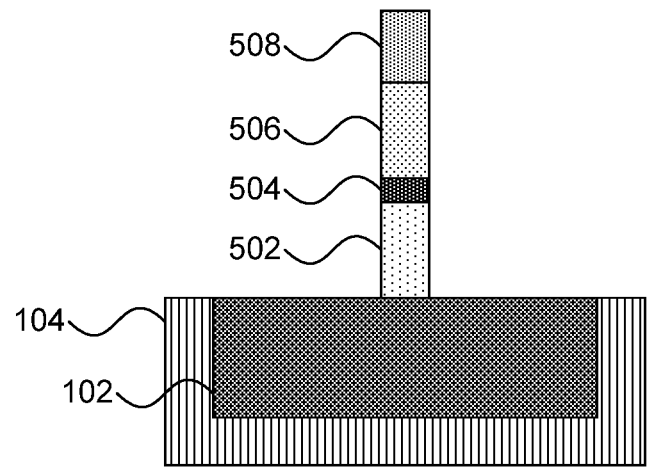
FIG. 5 is a cross-sectional view of a step in fabricating a magnetoresistive random access memory device in accordance with one embodiment of the present principles.

Referring now to FIG. 5, a step in fabricating an MRAM cell is shown. Another RIE etch is performed, using the metal layer 402 as a hardmask for patterning the magnetic layers that form the MRAM device. This leaves a pillar of magnetic layers 502, 504, and 506 with remaining metal layer 508 forming a cap having an exemplary thickness of about 750 angstroms.

Figure 6:
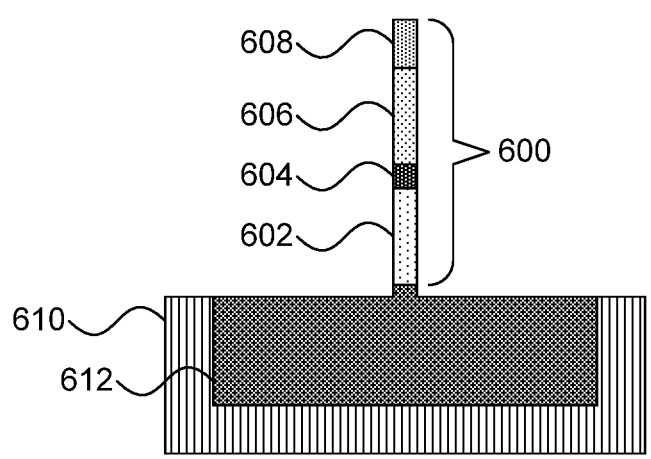
FIG. 6 is a cross-sectional view of a step in fabricating a magnetoresistive random access memory device in accordance with one embodiment of the present principles.

Referring now to FIG. 6, a step in fabricating an MRAM cell is shown. An ion beam etch is used to reduce the diameter of the pillar 600 forming the MRAM device. The ion beam etch also cleans the sidewalls of the MRAM device 600 of any residue or damage that might remain from the earlier RIE processes. The metal layer 610 and tantalum nitride landing pad 612 is also eroded by the ion beam etch, leaving a small raised portion of the landing pad 612 under the pillar 600, which is formed from the thinned magnetic tunnel junction layer 602, cap layer 604, ruthenium ion layer 606, and conductive hardmask layer 608.

Forming a finished device from this point includes forming a metal contact on the conductive hardmask layer 608. The landing pad 612 forms the bottom contact of the device. The MRAM device 600 is then controlled by passing currents between the two metal contacts, with information being stored in the device 600 by changing relative magnetization states in its magnetic layers.

The present embodiments yield MRAM devices having size ranges from several hundred nanometers to below about 10 nm. The resulting devices have good hardmask retention and aspect ratio, providing for good electrical contact. In addition, the size uniformity in an array of devices formed by the present embodiments exceeds the best known conventional methods by a factor of roughly three. Thus, uniformity and yield are both improved, which improves resistance distribution and reduces error rate. Whereas conventional techniques produce MRAM devices having rough edges and elliptical cross-sections, the present embodiments provide devices that have circular cross sections and much improved smoothness.

Figure 9:
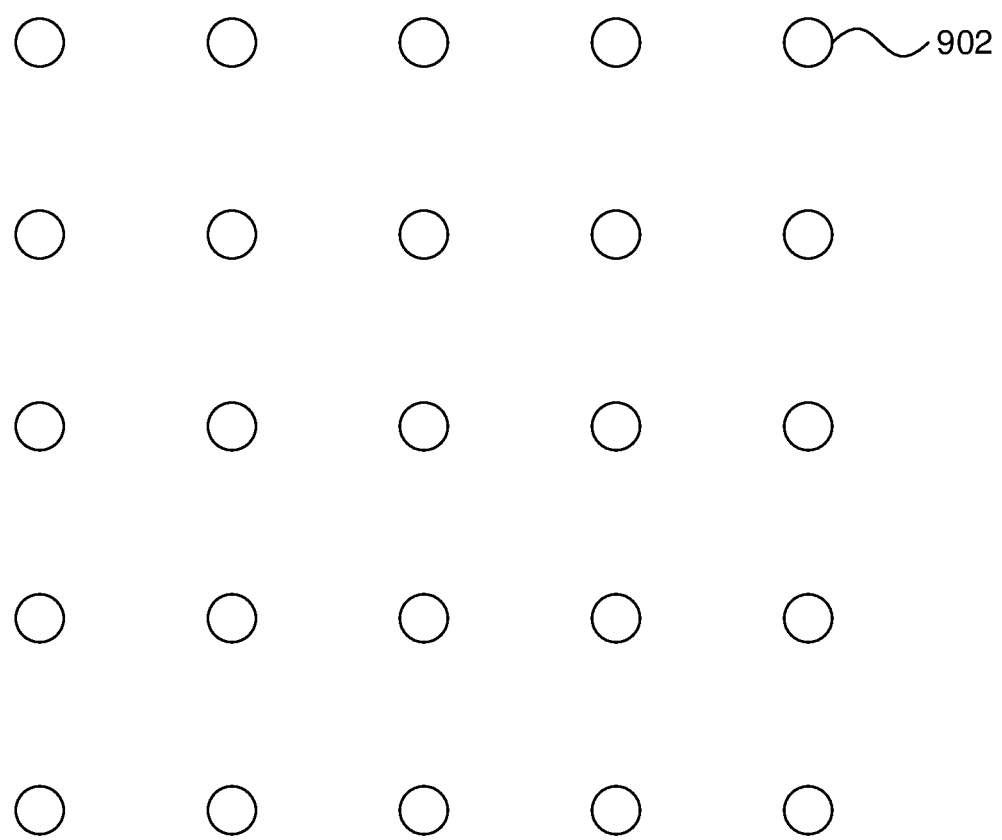
FIG. 9 is a top-down view of an array of magnetic tunnel junctions in accordance with one embodiment of the present principles.

Referring now to FIG. 9, a top-down view of an array of MRAM devices 902 is shown.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 7:
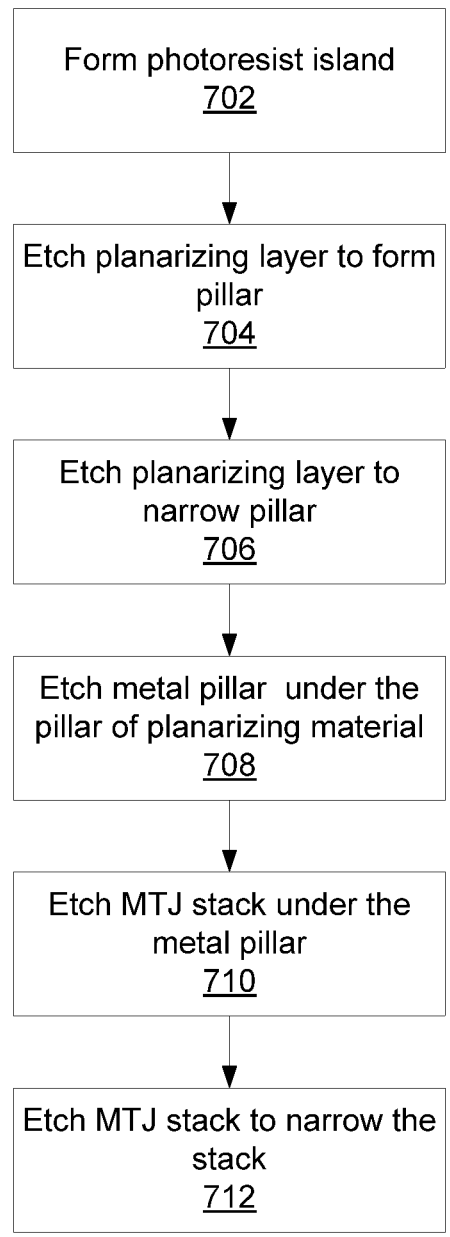
FIG. 7 is a block/flow diagram of a method of fabricating a magnetoresistive random access memory device in accordance with one embodiment of the present principles.

Referring now to FIG. 7, a method of forming an MRAM cell is shown. Block 702 forms the photoresist island 120. This may be performed using a layer of photoresist material and a reticle with a developer having a tone polarity opposite the polarity of the photoresist material. In one specific embodiment it is contemplated that a positive tone photoresist material is used with a dark field reticle that exposes only the portion of the photoresist material that is to form the island 120. The photoresist material is then exposed to a curing light source such as ultraviolet light. A negative tone developer is used to remove all portions of the photoresist material that were not exposed, leaving behind only the island 120. Alternatively, a negative tone photoresist material may be employed with a bright field reticle that blocks only the area of the island 120. The ultraviolet light then cures the photoresist material everywhere that was uncovered and a positive tone developer removes the cured material, leaving only the island 120 behind.

Block 704 performs an etch to form a pillar from the anti-reflective coating 118 and the planarizing layer 116. It is specifically contemplated that RIE is used to anisotropically remove material around the island 120 to form a pillar 202/204, but it should be understood that any appropriate anisotropic etch may be employed. Block 706 etches the resulting pillar of planarizing material 202 to reduce its diameter and decrease its roughness. The etch selectively affects the planarizing material 202 to produce a narrower pillar 302, leaving a cap of anti-reflective coating 204. It is specifically contemplated that a wet etch may be employed.

Block 708 performs a further anisotropic etch around the pillar of planarizing material 302 to form a metal pillar 402 having a diameter similar to the pillar of planarizing material 302. It is specifically contemplated that RIE may be used to form the metal pillar 402, but again it should be understood that any anisotropic etch appropriate to the materials may be used. Block 710 then etches the MTJ stack under the metal pillar 402 using a further anisotropic etch such as RIE. The metal layer 402 is used as a hardmask for this etch, with a cap of metal 508 remaining on top of the MTJ stack pillar 502/504/506. Block 712 etches the MTJ stack 502/504/506 and the metal cap 508 using, e.g., a wet etch to further reduce the diameter of the pillar 600 and to improve the smoothness of its surface. The etch further removes a top portion of the hardmask layer 612 around the pillar 600, such that a small portion of the material remains at the base of the pillar.

Figure 8:
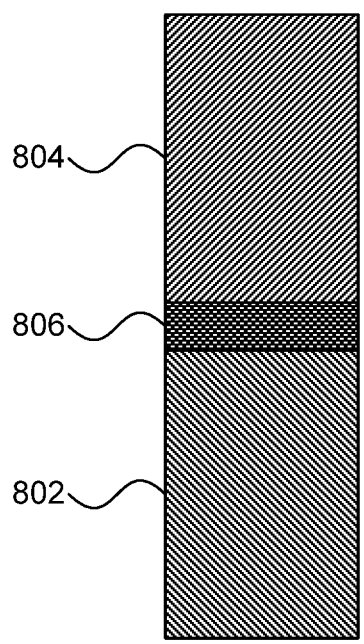
FIG. 8 is a cross-sectional view of a magnetic tunnel junction in accordance with one embodiment of the present principles.

Referring now to FIG. 8, a detailed cross-section of the magnetic tunnel junction layer 602 is shown. The magnetic tunnel junction is formed from pinned layer 802, free layer 804, with a tunnel barrier layer 806 between them. The magnetization of the pinned layer 802 is fixed in a given direction (e.g., "up"), and current passed through the tunnel barrier 806 causes the free layer 804 to assume a desired magnetization. The state of the device is then determined according to whether the free layer 804 has a magnetization that is parallel to, or anti-parallel to, the pinned layer 802.

A current is therefore used to set a desired polarity to the free layer 804, while a smaller current is used to read the stored polarity. The current is applied across the magnetic layers 802/804 and the tunnel barrier 806, where the magnetic layers 802/804 are conductive, but the tunnel barrier 806 is an insulator. However, the tunnel barrier 806 is made thin enough that electrons can pass through the barrier via quantum tunneling. The read current depends on the relative orientations of the magnetizations of the pinned and free layers 802/806, with a resistance of the device generally being higher when the magnetizations are anti-parallel and lower when the magnetizations are parallel. It is specifically contemplated that the free layer 804 is formed by a cobalt-iron-boron compound, while the tunnel barrier 806 is formed from, e.g., magnesium oxide. The pinned layer 802, meanwhile, may have a more complex structure that includes multiple layers with various magnetic and non-magnetic materials interleaving with one another to produce a relatively fixed magnetization.

The physical mechanism employed for writing is spin torque transfer. While a general current is generally unpolarized with respect to spin, in an MRAM device the pinned layer has the effect of polarizing the electrons' spins. These electrons transfer their angular momentum to the free layer at the junction between the free layer and the tunnel layer, reinforcing or reversing the magnetization of the free layer.

Having described preferred embodiments of spin torque MRAM devices and fabrication thereof using negative tone lithograph and ion beam etching (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A magnetoresistive memory cell, comprising,
   a magnetic tunnel junction pillar having a circular cross section, comprising a pinned magnetic layer, a tunnel barrier layer, and a free magnetic layer;
   a tantalum nitride layer having a raised region directly under the magnetic tunnel junction pillar;
   a first conductive contact above the magnetic tunnel junction pillar; and
   a second conductive contact below the magnetic tunnel junction pillar.

2. The magnetoresistive memory cell of claim 1, further comprising a ruthenium ion layer above the magnetic tunnel junction pillar and below the first conductive contact.

3. The magnetoresistive memory cell of claim 2, further comprising a tantalum nitride layer above the ruthenium ion layer.

4. An array of memory cells, comprising:
   a plurality of magnetoresistive memory cells, the magnetoresistive memory cells having a critical dimension uniformity within about ±3 nm, each cell comprising:
   a magnetic tunnel junction pillar having a circular cross section, comprising a pinned magnetic layer, a tunnel barrier layer, and a free magnetic layer;
   a first conductive contact above the magnetic tunnel junction pillar; and
   a second conductive contact below the magnetic tunnel junction pillar.

5. The array of memory cells of claim 4, wherein each magnetoresistive memory cell has a diameter of less than about 70 nm.

6. The array of memory cells of claim 4, wherein each cell further comprises a ruthenium ion layer above the magnetic tunnel junction pillar and below the first conductive contact.

7. The array of memory cells of claim 6, wherein each cell further comprises a tantalum nitride layer above the ruthenium ion layer.

8. The array of memory cells of claim 4, wherein each cell further comprises a tantalum nitride layer having a raised region directly under the magnetic tunnel junction pillar.

* * * * *